United States Patent [19]

Kitamura et al.

[11] Patent Number: 5,739,061
[45] Date of Patent: Apr. 14, 1998

[54] METHOD OF MANUFACTURING A SEMICONDUCTOR DEVICE USING GATE SIDE WALL AS MASK FOR SELF-ALIGNMENT

[75] Inventors: Mutsumi Kitamura; Naoto Fujishima, both of Nagano, Japan

[73] Assignee: Fuji Electric Co., Ltd., Japan

[21] Appl. No.: 439,972

[22] Filed: May 12, 1995

Related U.S. Application Data

[63] Continuation-in-part of Ser. No. 329,943, Oct. 26, 1994.

[30] Foreign Application Priority Data

| Oct. 26, 1993 | [JP] | Japan | 5-266761 |
| May 13, 1994 | [JP] | Japan | 6-099409 |
| May 25, 1994 | [JP] | Japan | 6-110621 |

[51] Int. Cl.$^6$ .................... H01L 21/8234; H01L 21/336
[52] U.S. Cl. .................... 438/275; 438/286
[58] Field of Search .................... 437/40 DM, 41 DM, 437/45; 438/268, 275, 286

[56] References Cited

U.S. PATENT DOCUMENTS 4,914,047  4/1990  Seki .................... 437/41 DM

FOREIGN PATENT DOCUMENTS

| 0484321A1 | 5/1992 | European Pat. Off. |
| 0653786A2 | 5/1995 | European Pat. Off. |

OTHER PUBLICATIONS

8057, MOS Technologies for Smart Power and High-Voltage Circuits, (1987)Nov. Paris,France Rossel.

G. Dolny et al.: IEDM 88 pp. 796–799 (1988) "Complementary DMOS/BiCMOS Technology for power IC applications".

N. Fujishima et al.: Proc. 5th International Symposium on Power Semiconductor Devices and ICs (1993) "High packing density power Bi–CMOS technology and its application for a motor drive LSI".

*Primary Examiner*—Brian Dutton
*Attorney, Agent, or Firm*—Rossi & Associates

[57] ABSTRACT

A method of manufacturing a BiCMOS apparatus including a DMOS is disclosed which reduces manufacturing steps, shortens manufacturing time and reduces manufacturing cost. A channel ion implanted layer is formed by implanting acceptor impurities from the surface of a P-type well 5. A poly-silicon gate electrode is formed on gate insulation film and local oxide film. Impurity ions are then implanted for forming P-type base region by employing the bipolar transistor process and by using the gate electrode as a mask. Then, side walls are formed at high temperature on both sides of the gate electrode by employing the CMOS process of forming the LDD structure. At the same time, the P-type base region is formed by diffusing the implanted impurity ions. An N$^+$-type source region is then formed self-aligned by employing the CMOS process for forming the N$^+$-type source and drain of the CMOS transistor and by using the gate electrode 10 as a mask for the self alignment.

12 Claims, 9 Drawing Sheets

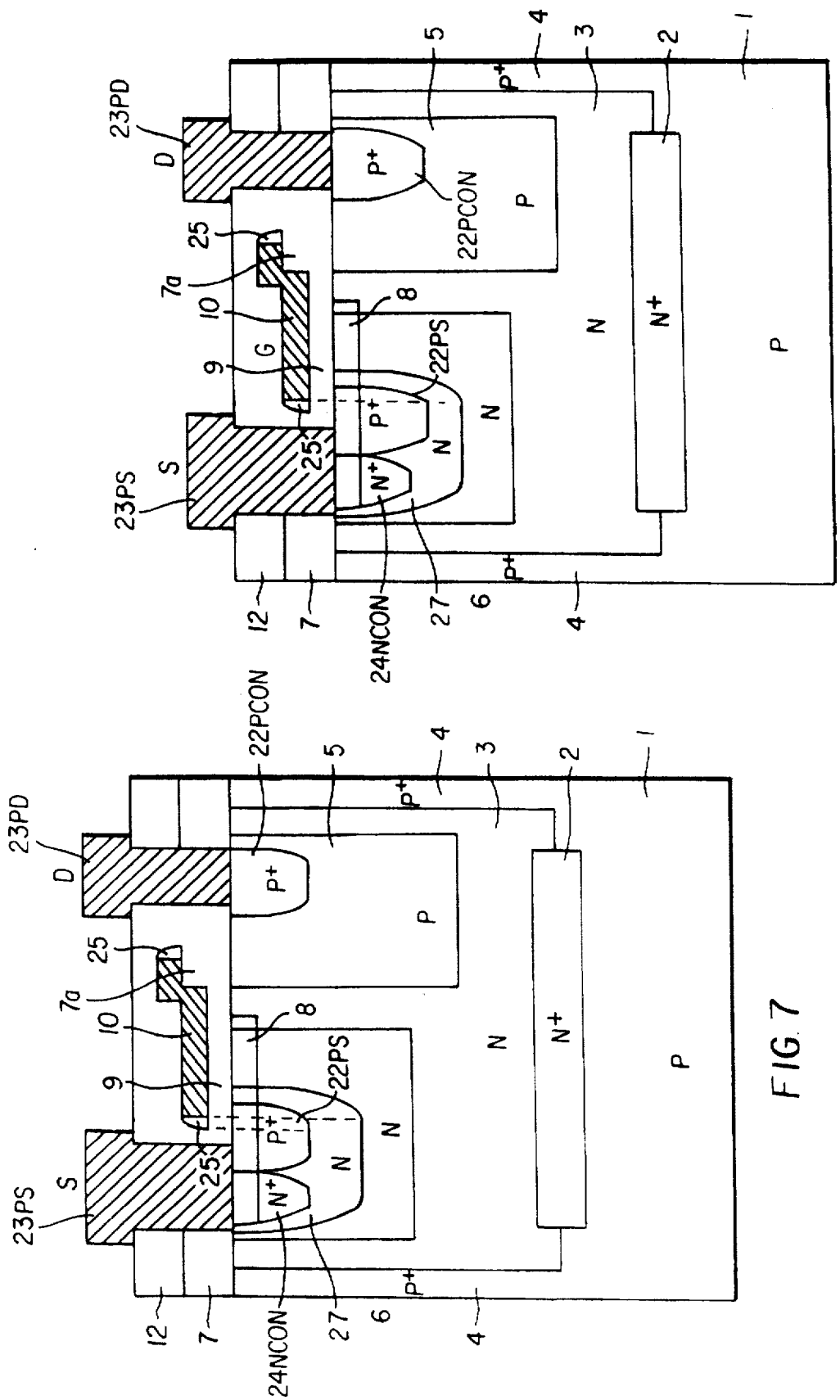

5,739,061

METHOD OF MANUFACTURING A SEMICONDUCTOR DEVICE USING GATE SIDE WALL AS MASK FOR SELF-ALIGNMENT

CROSS-REFERENCE TO RELATED APPLICATIONS

This application is a continuation-in-part of U.S. patent application Ser. No. 08/329,943, the contents of which are incorporated herein by reference, which was filed in the U.S. Patent and Trademark Office on Oct. 26, 1994.

BACKGROUND

The present invention relates to a BiCMOS processing technique for mounting a power MOS transistor, a bipolar transistor and a CMOS transistor on a common chip or substrate. FIG. 14 shows a CMOS device portion with a low-withstand voltage of a BiCMOS semiconductor device which has a double-well (twin-tub) structure. In FIG. 14, the CMOS portion is comprised of an $N^+$-type buried layer 2 formed on a P-type semiconductor substrate 1; an N-type epitaxial layer 3 grown over the buried layer 2; an isolated element island isolated by $P^+$-type isolation layers 4, 4 which reach the P-type substrate 1; and double wells (a P-type well 5 and an N-type well 6) formed in the isolated element island by implanting ions for forming the P-type well 5 and the N-type well 6 and by subsequent well-diffusion. After the double-well formation, a CMOS transistor is formed in the CMOS portion through the following steps. An active region is covered, for example, by nitride film etc., and then an element-isolating insulation film (local oxidizing film: LOCOS) 7 is formed on the $P^+$-type isolation layers 4, 4 and on a non-well portion between the P- and N-type wells 5 and 6 by selectively oxidizing the nitride film. A channel ion-implanted layer 8 is formed by implanting acceptor type (P-type) impurities such as $BF_2$ (boron difluoride) etc. very shallowly from the surfaces of the wells 5 and 6. Polysilicon gate electrodes 10, 10 are formed on gate insulation film 9 deposited on the wells 5 and 6. N-type low impurity concentration regions (LDD: Lightly doped drain) 15, 15 are formed by implanting N-type impurities such as phosphor etc. using the gate electrode 10 on the P-type well 5 as a mask for self-alignment. Side walls 25 are formed on the side faces of the gate electrodes 10, 10 by depositing oxidizing film by the low temperature CVD method (at 815° C.) and by subsequent etching. A $P^+$-type source region $11_{PS}$ and a $P^+$-type drain region $11_{PD}$ are formed by the self-alignment technique using the gate electrode 10 and the side walls 25, 25 on the N-type well 6 as masks. Through this step, a $P^+$-type well-contact region $11_{PCON}$ is formed simultaneously on the source side in the P-type well 5. An $N^+$-type source region $11_{NS}$ and an $N^+$-type drain region $11_{ND}$ are then formed by self-alignment using the gate electrode 10 and the side walls 25, 25 on the P-type well 5 as masks. Through this step, an $N^+$-type well-contact region $11_{NCON}$ is formed simultaneously on the source side in the N-type well 6. An interlayer insulation film 12 is then formed, and, finally, source electrodes $13_{NS}$, $13_{PS}$ and drain electrodes $13_{ND}$, $13_{PD}$, which fill contact holes opened through the insulation film 12, are deposited.

By adopting the LDD structure for the N-channel MOSFET of the CMOS portion, an electric field is relaxed in the drain regions, and hot carrier injection into the gate insulation film 9 is greatly reduced. Due to this, the gate insulation film 9 is prevented from deteriorating with time and the reliability of the gate insulation film 9 is improved. Though FIG. 14 shows the CMOS portion with the LDD structure which has the side walls 25 on both sides of the gate electrodes 10, 10, some BiCMOSs are comprised of a CMOS portion, which lacks the side walls 25, without the LDD structure. In addition, another process sequence may be adopted which forms the $P^+$-type source region $11_{PS}$ and drain region $11_{PD}$ using the gate electrode 10 as a mask for self-alignment in advance to the formation of side walls 25.

FIGS. 15 and 16 show structures of a high-withstand voltage DMOS portion (double-diffusion type insulated gate field effect transistor) as a power MOS portion. A P-type well 5 and an N-type well 6 of the N-channel type DMOS-FET shown in FIG. 15 are formed through similar steps to those for the CMOS portion. The N-type well 6 constitutes an offset region which functions as an expanded drain for reducing ON-resistance of the MOSFET. An active region is covered, for example, by nitride film, and then element-isolating insulation film (local oxidizing film: LOCOS) 7 is formed over $P^+$-type element isolation layers 4, 4, and thick local oxidizing film 7a on the P-type well side on the N-type well 6 by selectively oxidizing the nitride film. A channel ion-implanted layer 8 is formed by implanting acceptor type (P-type) impurities such as $BF_2$ etc. very shallowly from a surface of the P-type well 5. A gate electrode 10 is formed on gate insulation film 9 deposited on the P-type wells 5. A P-type base region 21 is formed in the P-type well 5 by using the gate electrode 10 as a mask for self-alignment. Base driving is employed for deeply diffusing the P-type base region 21, for example, at 1100° C. for 20 min or at 900° C. for 60 min. The deep diffusion of the P-type base region 21 contributes to increasing the withstand voltage of the high withstand voltage MOSFET. After the P-type base region 21 is formed, side walls 25, 25, comprised oxidizing film deposited by the CVD method, are formed. After the side walls 25, 25 are formed, an N+-type source region $26_{NS}$ is self-aligned in the heavily doped P-type base region 21 and an $N^+$-type well-contact region $26_{NCON}$ in the N-type B well 6 by double diffusion using the gate electrode 10 and the side walls 25, 25. Then, contact holes are opened through interlayer insulation film 12, and a source electrode $23_{NS}$ and a drain electrode $23_{ND}$ are deposited. The thick local oxidizing film 7a contributes to relaxing electric field localization onto the edge the drain and therefore to realizing a high withstand voltage.

In the P-type well 5, an N-channel DMOS structure is formed by the lateral diffusion length difference between the P-type base region 21 and the N-type source region $26_{NS}$. Since the DMOS structure facilitates, as compared with the general CMOSs, lowering resistance of the P-type base beneath the $N^+$-type source region $26_{NS}$, a parasitic transistor consisting of the N-type source region $26_{NS}$, the P-type base region 21 and the N-type well 6 hardly operates. Due to this, latching up of the DMOS is suppressed and the safe operation area of the DMOS is widened. In addition, since the $N^+$-type source region $26_{NS}$ is surrounded by the heavily doped P-type base region 21, punch through between the source and the drain is prevented, and, therefore, the withstand voltage of the DMOS is improved. In FIG. 15, the N-channel DMOS with the side walls 25, 25 shown exemplary may be replaced by an N-channel DMOS without the side walls 25, 25. Alternatively, the $N^+$-type source region $26_{NS}$ may be formed in advance to the formation of the side walls 25, 25.

FIG. 16 is a sectional view of a P-channel DMOSFET of the DMOS portion of the BiCMOS at a time of its source and drain electrodes formation. In FIG. 16, a P-type well 5 and an N-type well 6 are formed through similar steps to those for the CMOS portion and the P-type well 5 constitutes an offset region which functions as an expanded drain for reducing ON-resistance of the MOSFET. At first, an active region is covered by nitride film etc., and then element-isolating insulation film 7 is formed on P+-type element isolation layers 4, 4, and thick local oxidation film 7a on the N-type well side on the P-type well 5 by selectively oxidizing the nitride film. A channel ion-implanted layer 8 is formed by implanting acceptor type (P-type) impurities such as $BF_2$ etc. very shallowly from a surface of the N-type well 6. A gate electrode 10 is formed on a gate insulation film 9 deposited on the N-type wells 6. Side walls 25, 25, comprised of oxidizing film deposited by the CVD method, are formed on both side faces of the gate electrode 10. A $P^+$-type source region $22_{PS}$ is then self-aligned in the N-type well 6 by using the gate electrode 10 as a mask, and $P^+$-type well-contact region $22_{PCON}$ in the P-type well 5. An $N^+$-type well-contact region $24_{NCON}$ is then formed in the N-type well 6. Then, contact holes are opened through inter-layer insulation film 12, and a source electrode $23_{PS}$ and a drain electrode $23_{PD}$ are deposited. The thick local oxidation film 7a contributes to provision of higher withstand voltage by relaxing electric field localization onto the edge of the drain.

The side walls 25, 25 may be omitted, or the $P^+$-type source region $22_{PS}$ may be formed prior to the formation of the side walls 25, 25. In FIG. 16, in which the $P^+$-type source region $22_{PS}$ and the N-type well 6 constitute a DMOS structure, the $P^+$-type source region $22_{PS}$ is self aligned by masking of the side walls 25, 25 and the lateral diffusion length of the heavily doped $P^+$-type source region $22_{PS}$ is shorter by the length (width) of the side wall 25 as compared with a DMOS structure without the side walls 25, 25. Since the total donner impurity concentration in the surface layer of the N-type well 6 beneath the gate electrode 10 can be increased due to the shorter diffusion length, withstand voltage lowering caused by surface punch through is suppressed and larger current capacity of the DMOS is facilitated.

The bipolar transistor portion of the BiCMOS semiconductor device is comprised of a vertical NPN transistor and a lateral PNP transistor as shown in FIG. 17. Through processing steps similar to those for forming the CMOS portion, an $N^+$-type buried layer 2 is formed on a P-type substrate 1, an N-type epitaxial layer 3 is grown over the buried layer 2, and then, $P^+$-type element isolation layers 4, 4, 4 which reach the substrate 1 are formed to isolate element islands. In fabricating the horizontal NPN transistor, a P-type base region $31_{PS}$ is formed in the N-type epitaxial layer 3, and then, an $N^+$-type emitter region $32_{NE}$ and an $N^+$-type collector region $32_{NC}$ are formed. After opening contact holes through inter-layer insulation film 12, a base electrode $33_B$, an emitter electrode $33_E$, and a collector electrode $33_C$ are formed. In fabricating the lateral PNP transistor, a P-type emitter region $31_{PE}$ and a P-type collector region $31_{PC}$ are formed in the N-type epitaxial layer 3 by employing the step for forming the P-type base region $31_{PB}$ of the horizontal transistor, and then, $N^+$-type base region (base-contact) $32_{NB}$ is formed. Then, after opening contact holes through inter-layer insulation film 12, a base electrode $34_B$, an emitter electrode $34_E$, and a collector electrode $34_C$ are formed.

The BiCMOS structure according to the prior art which is comprised of the above described DMOS portion as the power MOS portion suffers the following problems. Since the CMOS, the bipolar transistor and the DMOS portions are formed on a common substrate, the BiCMOS is manufactured through many steps in a long processing time with high manufacturing cost. Since the base region of the second conductivity type (for example P-type) of the high-withstand voltage DMOS portion is formed by employing the step for forming the base region of the second conductivity type of the bipolar transistor, ions are implanted in the base region of the DMOS portion at relatively low dose amount so as not to lower the current amplification factor $h_{FE}$ of the bipolar transistor. Because of this, the base drive heat treatment becomes necessary to increase the withstand voltage of the high withstand voltage DMOS portion.

In view of the foregoing, an object of the present invention is to provide a manufacturing method which facilitates manufacturing a semiconductor device through less processing steps in a shorter period of time.

SUMMARY OF THE INVENTION

The object of the present invention is achieved by eliminating the base drive step required only for the high withstand voltage DMOS portion. In general, when a P-type impurity (the second conductivity type) such as boron is diffused in a region already heavily doped with an N-type (the first conductivity type) impurity such as arsenic, diffusion of the P-type impurity is considerably suppressed. Therefore, if ion-implantation is conducted for the source region of the first conductivity type after ion-implantation for the base region of the second conductivity type, diffusion of the impurity of the second conductivity type for forming the base region will be suppressed, because the dose amount of the impurity of the first conductivity is large. Thus, the total impurity amount in the base region is limited and lower withstand voltage may be caused. To avoid this problem, the base drive step, which is a heat treatment step for sufficiently diffusing the impurity, has been adopted in the base region formation. The present invention utilizes the side wall formation conducted between the base region formation and the source region formation in place of the base drive step.

That is, the object of the present invention is achieved by a method of manufacturing a semiconductor device, including a DMOS transistor with a channel of the first conductivity type, which method is comprised of steps of forming a well of the second conductivity type in a semiconductor region of the first conductivity type; forming a gate electrode on gate insulation film deposited on the semiconductor region; forming a base region of the second conductivity type from a major face of the well by using the gate electrode as a mask for self-alignment; forming side walls on side faces of the gate electrode, the step of forming the side walls being employed for driving the base region in place of driving the base region by heat treatment; and forming a source region of the first conductivity type from a major face of the base region using the side walls as a mask for self-alignment.

The object of the present invention is further achieved by a method of manufacturing a semiconductor device, including a DMOS transistor with a channel of the first conductivity type, which method is comprised of steps of forming a channel ion-implanted layer by implanting impurity ions of the second conductivity type from a major face of a well of the second conductivity type formed in a semiconductor region of the first conductivity type; forming a gate electrode on gate insulation film deposited on the semiconductor region; forming a base region of the second conductivity type from the major face of the well by using the gate electrode as a mask for self-alignment; forming side walls on side faces of the gate electrode, the step of forming the side walls being employed for driving the base region in place of driving the base region by heat treatment; and forming a source region of the first conductivity type from a major face of the base region using the side walls as a mask for self-alignment.

The side walls may be formed by thermal oxidation or by a CVD method under reduced pressure.

The base region of the second conductivity type may be formed by a step exclusive for the DMOS transistor. However, when the semiconductor device is a CMOS semiconductor device further comprised of a CMOS transistor, following process may be employed. That is, by forming the CMOS transistor on a common substrate in a LDD structure having side walls on both side face of its gate electrode, the side walls of the DMOS transistor may be formed by employing a step for forming the side walls of the CMOS transistor. In addition, the well of the DMOS transistor may be formed by employing a step for forming a well of the second conductivity type of the CMOS transistor. Moreover, the base region of the DMOS transistor may be formed by employing a step for forming a source region and a drain region of the second conductivity type of the CMOS transistor. Furthermore, the source region of the DMOS transistor may be formed by employing a step for forming a source region and a drain region of the first conductivity type of the CMOS transistor.

When the semiconductor device is a BiCMOS semiconductor apparatus comprised of a CMOS transistor and a bipolar transistor formed on a common substrate, following process may be adopted. That is, the base region of the DMOS transistor may be formed by employing a step for forming a base region of the second conductivity type of the bipolar transistor. In addition, the source region of the DMOS transistor may be formed by employing a step for forming an emitter region of the first conductivity type of the bipolar transistor.

The objects of the present invention is also achieved by a method of manufacturing a semiconductor device, including a DMOS transistor with a channel of the second conductivity type, which method is comprised of steps of forming a gate electrode on gate insulation film deposited on a semiconductor of the first conductivity type; forming a base region of the first conductivity type by using the gate electrode as a mask for self-alignment; forming side walls on side face s of the gate electrode, the step of forming the side walls being employed for driving the base region in place of driving the base region by heat treatment; and forming a source region of the second conductivity type from a major face of the base region using the side walls as a mask for self-alignment.

The objects of the present invention is also achieved by a method of manufacturing a semiconductor device, including a DMOS transistor with a channel of the second conductivity type, which method is comprised of steps of forming a channel ion-implanted layer by implanting impurity ions of the second conductivity type on a side in a semiconductor region of the first conductivity type; forming a gate electrode on gate insulation film deposited on the semiconductor region; forming a base region of the first conductivity on a side of the channel ion-implanted layer in the semiconductor region using the gate electrode as a mask for self-alignment; forming side walls on side faces of the gate electrode, the step of forming the side walls being employed for driving the base region in place of driving the base region by heat treatment; and forming a source region of the second conductivity type from a major face of the base region using the side walls as a mask for self-alignment.

The side walls may be formed by thermal oxidation or by a CVD method under reduced pressure.

The base region of the first conductivity type may be formed by a step exclusive for the DMOS transistor. However, when the semiconductor device is a CMOS semiconductor device further comprised of a CMOS transistor, following process may be employed. That is, by forming the CMOS transistor on a common substrate in a LDD structure having side walls on both side face of its gate electrode, the side walls of the DMOS transistor may be formed by employing a step for forming the side walls of the CMOS transistor. In addition, the source region of the second conductivity type of the DMOS transistor may be formed by employing a step for forming a source region and a drain region of the second conductivity type of the CMOS transistor. Moreover, the base region of the first conductivity type of the DMOS transistor may be formed by employing a step for forming a source region and a drain region of the first conductivity type of the CMOS transistor.

When the semiconductor device is a BiCMOS semiconductor device comprised of a CMOS transistor and a bipolar transistor formed on a common substrate, following process may be adopted. That is, the source region of the second conductivity type of the DMOS transistor may be formed by employing a step for forming a base region of the second conductivity type of the bipolar transistor. The source region of the DMOS transistor may also be formed by employing a step for forming an emitter region of the second conductivity type of the bipolar transistor.

In this case, it is preferable to conduction-implantation forming the source region of a $P^+$-type and the drain region of the $P^+$-type of the CMOS transistor, and then ion-implantation is conducted for forming the source region of an $N^+$-type and the drain region of the $N^+$-type of the CMOS transistor. It is also preferable to form the base region of the DMOS transistor by implanting ions at a dose amount of $5 \times 10^{14}$ $cm^{-2}$ or less.

The manufacturing steps are reduced by employing the side wall formation step to base formation for the substitution of the base drive step which is necessary only for forming the high withstand voltage DMOS portion. Since the drive by heat treatment for expanding the base region as deeply as necessary is almost satisfactorily replaced by the side wall formation, insufficient depth of the base region which lowers the withstand voltage is not caused. Sufficient heat treatment effect is obtained by forming the side walls by thermal oxidation or by CVD under reduced pressure.

When the semiconductor device is a CMOS semiconductor device, the manufacturing steps are reduced by forming the CMOS portion in a LDD structure and by employing the side wall formation step to the side wall formation of the DMOS portion. As a matter of course, the LDD structure facilitates integrating the CMOS portion and the DMOS portion into a monolithic circuit. The LDD structure also facilitates preventing the hot carriers from injection into the gate insulation film of the CMOS portion and improves the reliability of the CMOS transistor. The manufacturing steps are also reduced by employing the CMOS processing steps for forming the well of the second conductivity type, the source of the second conductivity type and the drain of the second conductivity type and the steps for forming the source of the first conductivity type and the drain of the first conductivity type to the DMOS processing steps for forming the well of the second conductivity type, the base of the second conductivity type, and the source of the first conductivity type. In so far as the CMOS is concerned, since the drive time for the channel is short and since, due to this, the surface impurity concentration remains high, the dose amount may be lowered in correspondence with the high surface impurity concentration.

When the semiconductor device is a BiCMOS semiconductor device, the manufacturing steps are reduced by employing the steps for forming the base region of the second conductivity type and the emitter region of the first conductivity type of the bipolar transistor to the steps for forming the base region of the second conductivity type and the source region of the first conductivity type of the CMOS transistor. In so far as the bipolar transistor is concerned, since the base region of the second conductivity type is shallowly diffused, the current amplification factor $h_{FE}$ is improved.

The manufacturing method of the present invention for manufacturing a semiconductor device which includes DMOS transistor with a channel of the second conductivity type reduces the manufacturing steps by employing the side wall formation step to the base drive step necessary for forming the high withstand voltage DMOS portion. Since the drive by heat treatment for expanding the base region as deeply as necessary is almost satisfactorily replaced by the side wall formation, insufficient depth of the base region which lowers the withstand voltage is not caused. Sufficient heat treatment effect is obtained by forming the side walls by thermal oxidation or by CVD under reduced pressure.

As described earlier, when the semiconductor device is a CMOS semiconductor device, by forming the CMOS portion in a LDD structure and by employing the side wall formation step to the side wall formation of the DMOS portion, the manufacturing steps are reduced and the reliability of the CMOS portion is improved. The manufacturing steps are also reduced by employing the CMOS processing steps for the source of the first conductivity type and the drain of the first conductivity type, and the steps for forming the source of the second conductivity type and the drain of the second conductivity type to the DMOS processing steps for forming the base of the first conductivity type, and the source of the second conductivity type.

As described earlier, when the semiconductor device is a BiCMOS semiconductor device, the manufacturing steps are reduced by employing the steps for forming the base region of the first conductivity type and the emitter region of the second conductivity type of the bipolar transistor to the steps for forming the base region of the first conductivity type and the source region of the second conductivity type of the DMOS transistor. In so far as the bipolar transistor is concerned, since the base region of the first conductivity type is shallowly diffused, the current amplification factor $h_{FE}$ is improved.

When the semiconductor device is a CMOS semiconductor device, the withstand voltage of the DMOS transistor is improved by forming its P-type base region as deeply as possible by implanting the impurity in the P⁺-type source and drain of the CMOS portion, and then by implanting the impurity in the N⁺-type source and drain of the CMOS portion.

The withstand voltage of the DMOS transistor is further improved by implanting the impurity in the P⁺-type source and drain at the dose amount lower than usual, e.g. around $1 \times 10^{14}$ cm$^{-2}$.

BRIEF DESCRIPTION OF THE DRAWINGS

The invention will be described with reference to the following detailed description of the preferred embodiments and the accompanying drawings, wherein:

FIG. 7 is a sectional view showing an embodiment structure at source and drain electrode formation of the P-channel DMOSFET portion of the high withstand voltage DMOS obtained by the BiCMOS process according to the present invention;

FIG. 8 is a sectional view showing another embodiment structure at source and drain electrode formation of the P-channel DMOSFET portion of the high withstand voltage DMOS obtained by the other BiCMOS process according to the present invention;

DETAILED DESCRIPTION OF THE PREFERRED EMBODIMENTS

Figure 2:
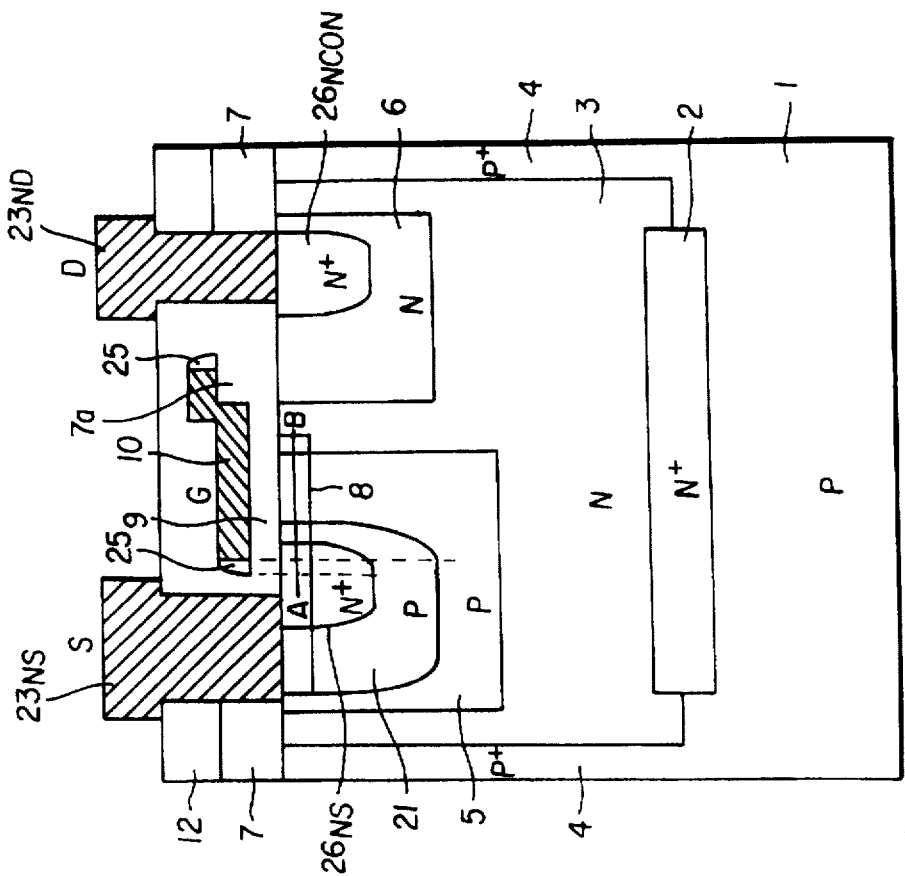
FIG. 2 is a sectional view showing an embodiment structure at source and drain electrode formation of the N-channel DMOSFET of the high withstand voltage DMOS portion in the BiCMOS process according to the present invention.

Now the present invention will be described in detail hereinafter with reference to the accompanied drawings which illustrate preferred embodiments of the present invention.

Table 1 lists the BiCMOS process sequences, in which an open circle indicates that the designated step is included. Though most of the process sequences are conducted from top to bottom of Table 1, step order may be changed in some sequences. In addition, some devices (element) may be formed in the steps indicating other wise; that is, for example, a source region may be formed in a step designated as "Base".

the BiCMOS process according to the present invention. In the embodiment of the DMOS portion, as listed in Table 1 and similarly as by the prior art, an $N^+$-type buried layer 2 is formed on a P-type semiconductor substrate 1. An N-type epitaxial layer 3 is grown over the buried layer 2, and then, $P^+$-type element isolation layers 4, 4 which reach the P-type semiconductor substrate 1 is formed to isolate an element island. A P-type well 5 and an N-type well 6 are formed in the isolated element island by employing ion-implantation steps for P- and N well formation in the CMOS portion and by subsequent well diffusion. The N-type well 6 functions as an offset region as an expanded drain for reducing ON-resistance of the MOSFET. An active region is then covered, for example, by nitride film, and element-isolating insulation film (local oxidizing film: LOCOS) 7 is formed on the $P^+$-type element isolation layers 4, 4, and thick local oxidizing film 7a is formed on the side of the P-type well 5 above the N-type well 6 by selectively oxidizing the nitride film. A channel ion-implanted layer 8 is then formed by shallowly implanting impurities of the acceptor type (P-type) such as $BF_2$ from the surface of the P-type well 5. After forming the ion-implanted layer 8, a poly-silicon gate electrode 10 is formed on gate insulation film 9 and the local oxidizing film 7a.

FIG. 2 is a sectional view showing an embodiment structure at source and drain electrode formation of the N-channel DMOSFET of the high withstand voltage DMOS portion in the BiCMOS process according to the present invention. After the gate electrode 10 is formed, a P-type base region (channel diffusion region) 21 is formed in the P-type well 5 by employing a doping step of the bipolar transistor and by using the gate electrode 10 as a mask for self-alignment. After the P-type base region 21 is formed,

TABLE 1

Process sequence and element devices

| | Device | | | | | | | | | | | | | | | |
|---|---|---|---|---|---|---|---|---|---|---|---|---|---|---|---|---|
| | CMOS | | | | NDMOS | | | PODMOS | | | | NPN | | | PNP | |
| | 9 | | 10 | | | | | | | | | | | | | |
| | N | P | N | P: | 1 | 2 | 3 | 5 | 6 | 7 | 8 | 11 | 13 | 15 | 12 | 14 | 16 |
| Step | ch | ch | ch | ch | | | | | | | | | | | | | |
| $N^+$ buried layer | Δ | Δ | Δ | Δ | Δ | Δ | Δ | Δ | Δ | Δ | Δ | O | O | O | O | O | O |
| Epitaxial layer growth | Δ | Δ | Δ | Δ | Δ | Δ | Δ | Δ | Δ | Δ | Δ | O | O | O | O | O | O |
| $P^+$ element isolation | Δ | Δ | Δ | Δ | Δ | Δ | Δ | Δ | Δ | Δ | Δ | O | O | O | O | O | O |
| P well | O | | O | | O | O | O | O | O | O | O | | | O | | O | |
| N well | | O | | O | O | O | O | O | O | O | O | | | | | | |
| Selective oxidation | O | O | O | O | O | O | O | O | O | O | O | | | | | | |
| Channel | O | O | O | O | Δ | Δ | Δ | Δ | Δ | Δ | Δ | | | | | | |
| Gate formation | O | O | O | O | O | O | O | O | O | O | O | | | | | | |
| LDD | O | | O | | | | | | | | | | | | | | |
| N emitter | | | | | O | * | * | * | * | * | | O | | | O | | |
| N base | | | | | | | | | O | O | | | O | | | O | |
| P base | O | O | | | | | O | | O | | O | | O | | | | |
| Side Wall formation | O | | O | | O | O | O | O | O | O | O | | | | | | |
| $P^+$ source | | | O | O | | | O | | O | | O | | O | O | | O | O |
| $N^+$ source | O | O | O | O | O | | * | * | * | * | * | O | | | O | | |
| Contact | O | O | O | O | O | O | O | O | O | O | O | O | O | O | O | O | O |
| Electrode | O | O | O | O | O | O | O | O | O | O | O | O | O | O | O | O | O |

Δ The step may be omitted.
*One of the two steps is applied.

(N-channel MOSFET in high withstand voltage DMOS portion)

Figure 1:
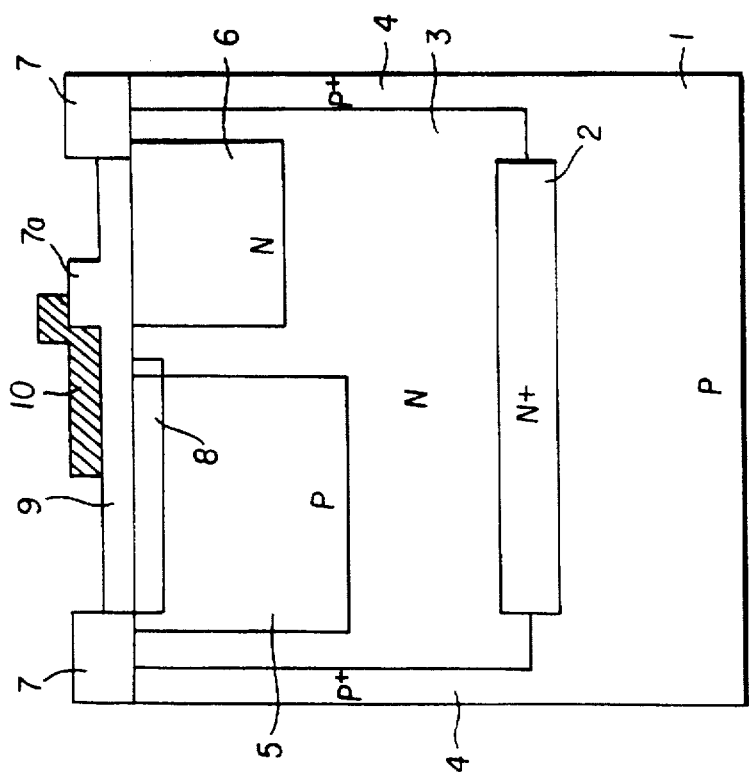
FIG. 1 is a sectional view showing an embodiment structure at gate electrode formation of the N-channel DMOSFET of the high withstand voltage DMOS portion in the BiCMOS process according to the present invention.

FIG. 1 is a sectional view showing an embodiment structure at gate electrode formation of the N-channel DMOSFET of the high withstand voltage DMOS portion in side walls 25, 25 of thermal oxidizing film are formed on the side faces of the gate electrode 10 by an exclusive step or by employing a process for forming an LDD structure for the CMOS portion described later. After the side wall formation, an N$^+$-type source region 26$_{NS}$ is formed in the heavily doped P-type base region 21 by double diffusion using the gate electrode 10 and the side wall 25 as a mask for self-alignment by employing the CMOS process for forming the N$^+$-type source and drain. An N$^+$-type well-contact region 26$_{NCON}$ is formed in the N-type well 6.

After forming inter-layer insulation film 12, contact holes are opened through the insulation film 12, and a source electrode 23$_{NS}$ and a drain electrode 23$_{ND}$ are formed. The thick local oxidation film 7a relaxes electric field localization onto the edge of the drain and contributes to increasing withstand voltage.

An N-channel type DMOS (double diffused MOS) structure, formed by lateral diffusion length difference between the P-type base region 21 and N$^+$-type source region 26$_{NS}$ and the thickness of the side wall 25, is formed as a channel diffusion region in the P-type well 5. Since the DMOS structure usually facilitates reducing the P-type base resistance beneath the N$^+$-type source region 26$_{NS}$ more than the usual CMOSs, a parasitic bipolar transistor comprised of the P-type base region 21 and the N-type well (drain region) 6 hardly operates, which prevents latch up and facilitates widening the safe operation area. In addition, since the N$^+$-type source region 26$_{NS}$ is surrounded by the heavily doped P-type base region 21, punch through between the source and the drain is prevented, and withstand voltage increase is facilitated.

Figure 3A:
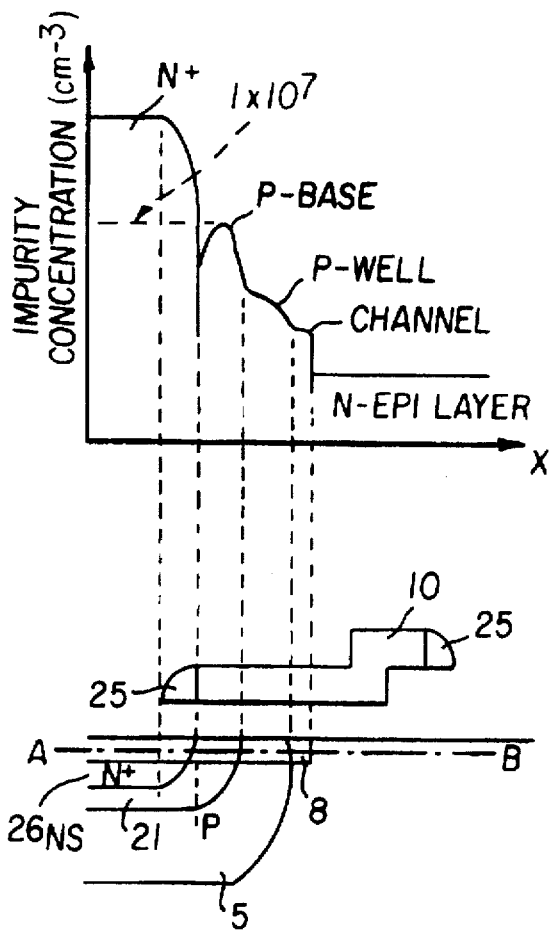
FIG. 3 (a) is a graph showing the impurity distribution on the horizontal section along the line A'–B' of the prior art in FIG. 15 and FIG. 3 (b) is a graph showing the impurity distribution on the horizontal section along the line A–B of FIG. 2.
Figure 3B:
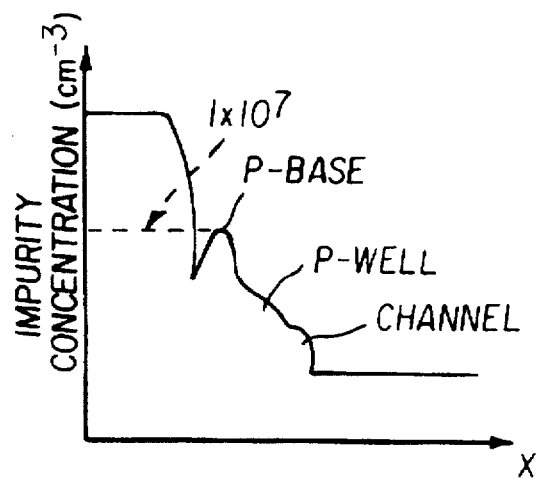

In this embodiment, the base drive step for forming the P-type base region 21 deeply at 1100° C. is omitted and the side walls are not formed by the CVD under reduced pressure. In this embodiment, the side walls are formed by the thermal oxidation at 900° C. for 30 min. Impurity distribution along A–B section of the DMOS portion of FIG. 2, which omits the base drive step and form the side walls by the CVD under reduced pressure, is shown in FIG. 3(a). FIG. 3(b) shows impurity distribution along A–B section of the DMOS portion which forms the side walls by thermal oxidation. As we know from FIGS. 3(a) and 3(b), almost the same impurity distribution is obtained by optimizing the conditions for the side wall formation even when the base drive step is omitted. Since the portion of the P-type base region 21 beneath the gate electrode 10 functions as a channel, the portion should be doped to a certain dose level. It has been revealed experimentally that the withstand voltage is around 90 V at the optimum impurity concentration of 1×10$^{17}$ cm$^{-3}$ and the withstand voltage is around 5 V at the impurity concentration of 5×10$^{16}$ cm$^{-3}$. FIG. 3(b) shows that the optimum impurity concentration of 1×10$^{17}$ cm$^{-3}$ is obtained by forming the side walls by thermal oxidation without conducting base drive. That is, the property with the similar excellence is obtained even when the base drive step is omitted. Defects caused by the high temperature heat treatment is reduced by omitting the base drive step. When the oxidizing film is formed by the thermal oxidation, the substrate is also oxidized. However, the side walls are formed on both side faces of the ploy silicon gate electrode 10, while the substrate is made of single crystal silicon. Growth rate of oxidizing film in the single crystal silicon is, though it depends on the conditions, about a half of the poly silicon. It has been known that a ratio of the consumed substrate thickness to the growing oxidized film thickness is 0.44. Therefore, when a side wall is grown to a thickness of 120 nm, the thickness of the consumed substrate is only 26.4 nm (120×0.5×0.44=26.4 nm), which is not so thick as to badly affects the device properties.

The present embodiment reduces processing steps by employing the processing steps for the other portions. The P-type well 5 and the N-type well 6 are formed by employing the steps for P- and N well formation in the CMOS portion; the P-type base region 21 by employing the formation step for the P-type base region of the bipolar transistor, the side walls 25, 25 by employing the process for forming the LDD structure for the CMOS portion; and the N$^+$-type source region 26$_{NS}$ by employing the steps for forming the N$^+$-type source and drain of the CMOS portion.

Figure 4:
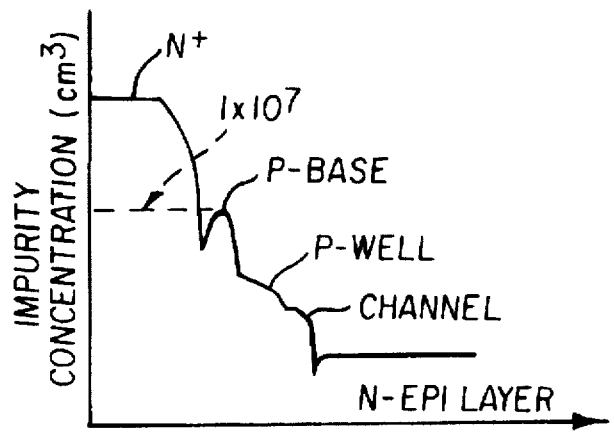
FIG. 4 is a graph showing the impurity distribution on the section along the line A–B in FIG. 2 of the high withstand voltage DMOS portion, the side walls of the gate electrode of which are formed by the CVD method under reduced pressure in the BiCMOS process according to the present invention.

The side walls may be formed by CVD under reduced pressure. However, it has been revealed experimentally that low withstand voltage of around 5 V is obtained by the usual CVD method under reduced pressure (120 nm in deposition thickness at 815° C. for 60 min). To avoid the low withstand voltage and to obtain the maximum surface impurity concentration of 1×10$^{17}$ cm$^{-3}$ in the P-type base region under the gate electrode, the CVD step is conducted at a temperature, e.g. 900° C., at which the diffusion coefficient of the N-type impurity is large. FIG. 4 shows impurity distribution along A–B section of the DMOS portion of FIG. 2 formed by another embodiment of the present invention which forms the side walls by the CVD at 900° C. for 30 min. As FIG. 4 shows, the same impurity distribution as shown in FIG. 3(a) is obtained without any base drive step.

The N$^+$-type source region 26$_{NS}$, formed in the above described embodiment by employing the step for forming the N$^+$-type source and drain of the CMOS portion, may be formed also by employing the step for forming the N$^+$-type emitter region of the bipolar transistor.

Figure 5:
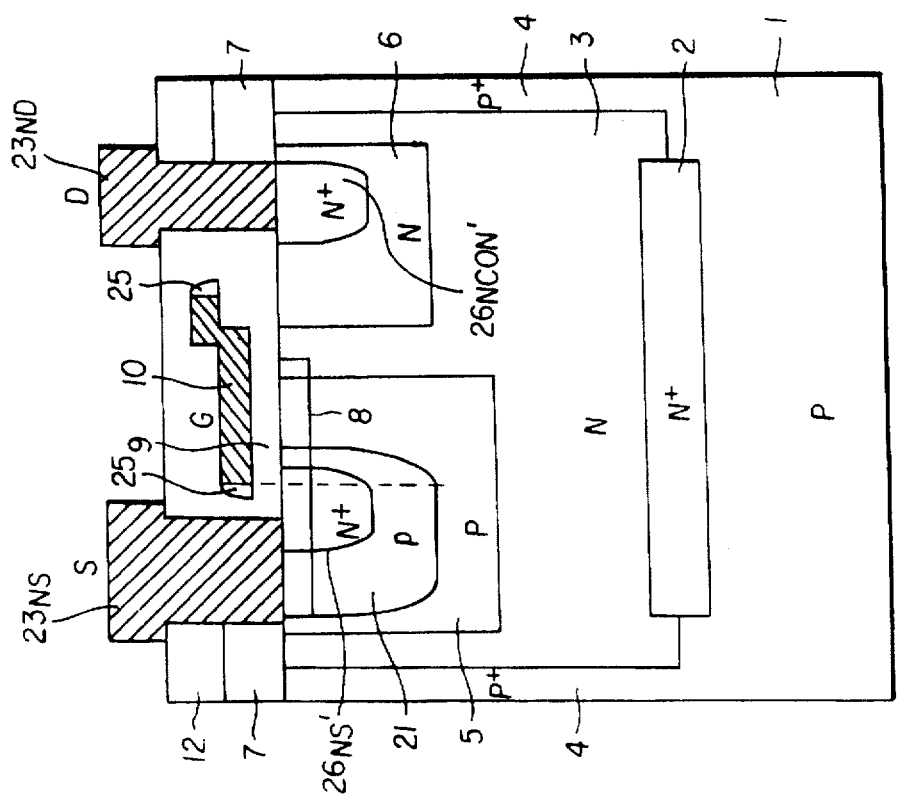
FIG. 5 is a sectional view showing another embodiment structure at source and drain electrode formation of the N-channel DMOSFET portion of the high withstand voltage DMOS obtained by the other BiCMOS process according to the present invention.

Alternatively, a step for exclusively forming the N$^+$-type source may be inserted before the step for the P-type base region 21 as the process sequence 2 of Table 1 describes. That is, as shown in FIG. 5, an N$^+$-type source region 26$_{NS}$' is formed in the P-type well 5 by an exclusive step for forming the N$^+$-type source of the DMOS using the gate electrode 10 as a mask for self-alignment, and an N$^+$-type well-contact region 26$_{NCON}$' in the N-type well 6. Then, the P-type base region 21 is formed by employing the step for forming the P-type base region of the bipolar transistor using the gate electrode 10 as a mask for self-alignment. In addition, since the CMOS adopts the LDD structure, the contact holes are opened through the inter-layer insulation film 12 and the source electrode 23$_{NS}$ and the drain electrode 23$_{ND}$ are formed after the side walls 25, 25 are formed on both side faces of the gate electrode 10.

The impurity concentrations in the N$^+$-type source region 26$_{NS}$' and the N$^+$-type well-contact region 26$_{NCON}$' are lower than those in the N$^+$-type source region 26$_{NS}$ and the N$^+$-type well-contact region 26$_{NCON}$ shown in FIG. 2. Though the side wall 25 does not show any masking effect since the source region 26$_{NS}$' is formed in advance to the side wall formation, the length of the P-type base region 21 in the total channel length can be set longer than that obtained by employing the CMOS process, since the impurity concentration in the N$^+$-type source region 26$_{NS}$' can be controlled at the optimum value by the exclusive DMOS process. Therefore, the withstand voltage and the current capacity of the DMOS portion can be increased. Further, since the P-type base region 21 is formed by employing the step for forming the P-type base region of the bipolar transistor in advance to the formation of the side wall 25, the DMOS structure which includes the N$^+$-type source region 26$_{NS}$' and the P-type base region 21 can be obtained in the P-type well 5 beneath the gate electrode similarly as in the prior art even when the side wall 25 is formed in the DMOS portion as well as in the CMOS portion. Therefore, the DMOS portion and the CMOS portion which include the side walls can be integrated into a monolithic circuit.

The P-type base region may be formed by slightly modifying the process sequences 3, 4 so as to from the $P^+$-type source and drain of the CMOS portion prior to the side wall formation and by employing the modified source and drain formation step for the CMOS portion. However, when the modified process is employed, the threshold value is increased and a sufficient current is not obtained due to the large dose amount of the P-type impurities in the usual $P^+$-type source and drain formation. To avoid this problem, $P^+$-type impurity such as boron is implanted at the relatively lower dose level of e.g. $5 \times 10^{14}$ cm$^{-2}$. In this case, the order of ion-implantation is important, since the P-type impurity and the N-type impurity are successively implanted using the same mask. When priority is given to the property of the CMOS portion and dose amount of the P-type impurity is set at a high level, impurities are implanted in the order of from the N-type to the P-type. When priority is given to the property of the DMOS portion and dose amount of the P-type impurity is set at a low level, impurities are implanted in the order of from the P-type to the N-type. This is because implantation of impurities with large mass number such as arsenic causes defects in the substrate crystal and hinders deep diffusion of the impurity implanted next.

Figure 6:
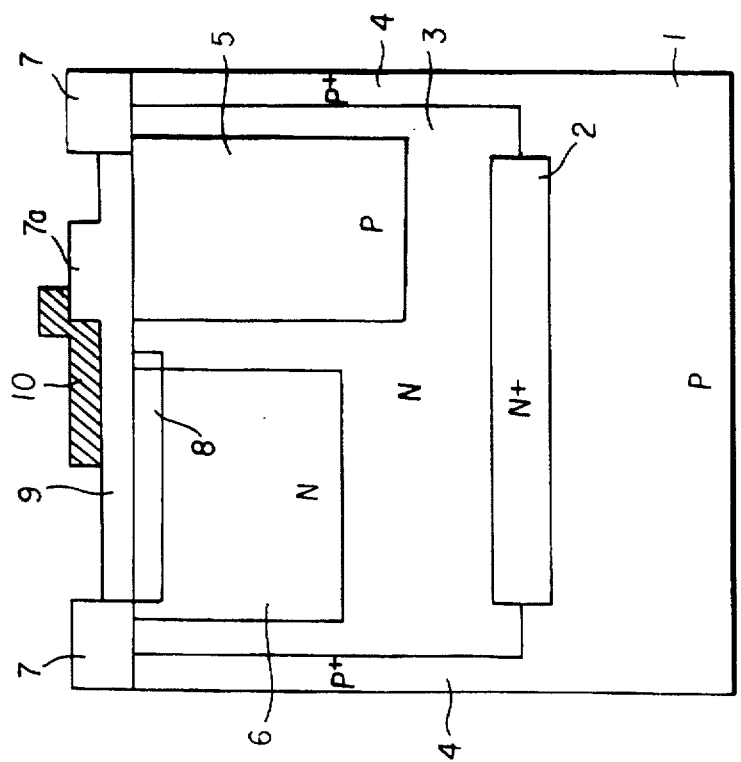
FIG. 6 is a sectional view showing an embodiment structure at gate electrode formation of the P-channel DMOSFET portion of the high withstand voltage DMOS portion obtained by the BiCMOS process according to the present invention.

FIG. 6 is a sectional view showing an embodiment structure at gate electrode formation of the P-channel DMOSFET of the high withstand voltage DMOS portion in the BiCMOS process according to the present invention. In the embodiment of the DMOS portion, as described by the sequence 8 of Table 1, an $N^+$-type buried layer 2 is formed on a P-type semiconductor substrate 1. An N-type epitaxial layer 3 is grown over the buried layer 2, and then, a $P^+$-type element isolation layers 4, 4 which reach the P-type semiconductor substrate 1 are formed to isolate an element island. A P-type well 5 and an N-type well 6 are formed in the isolated element island by ion-implantation for the P- and N wells and by subsequent well diffusion. The P-type well 5 functions as an offset region which functions as an expanded drain for reducing ON-resistance of the MOSFET. Then, an active region is covered with nitride film, and element-isolating insulative film (local oxidizing film: LOCOS) 7 is formed on the $P^+$-type isolation layers 4, 4, and thick local oxidation film 7a is formed on the side of the N-type well above the P-type well 5 by selectively oxidizing the nitride film. Then, an ion-implanted layer 8 is formed by shallowly implanting impurities of the acceptor type (P-type) such as $BF_2$ from the surface of the N-type well 6. Then, a gate electrode 10 is formed on gate insulation film 9 and the local oxidation film 7a.

FIG. 7 is a sectional view showing an embodiment structure at source and drain electrode formation of the P-channel DMOSFET of the high withstand voltage DMOS portion in the BiCMOS process according to the present invention. After the gate electrode 10 is formed, an N-type base region 27 is doped by employing the step for the bipolar transistor using the gate electrode 10 as a mask for self-alignment. Then, side walls 25, 25 of oxidizing film are formed by CVD under reduced pressure at 900° C. for 30 min by an exclusive step or by employing the CMOS process for forming the LDD structure. According to the prior art, the side walls 25, 25 are formed by the CVD method under reduced pressure at a low temperature (815° C.) after the base drive at 1100° C. for 20 min in succession to the doping for the N-type base region 27. The present invention omits the base drive step by rising the temperature of the CVD under reduced pressure. After the side wall formation, a $P^+$-type source region $22_{PS}$ and a F-type well-contact region $22_{PCON}$ are self-aligned by employing the step for forming the $P^+$-type source and drain of the CMOS portion and by using the gate electrode 10 and the side walls 25, 25 as a mask. Then, an $N^+$-type well-contact region $24_{NCON}$ is formed in the N-type well 6 by employing the step for forming the $N^+$-type source and drain of the CMOS portion. Contact holes are then opened through insulation film 12 and a source electrode $23_{PS}$ and a drain electrode $23_{PD}$ are deposited. The thick local oxidation film 7a relaxes electric field localization onto the drain edge and contributes to increasing withstand voltage.

FIG. 8 is a sectional view showing another embodiment of the P-channel DMOS transistor according to the present invention. Though the $P^+$-type source region $22_{PS}$ and the $P^+$-type well-contact region $22_{PCON}$ are formed by employing the step for forming the $P^+$-type source and drain of the CMOS portion in the P-channel DMOS transistor shown in FIG. 7, a $P^+$-type source region $22_{PS}'$ and a $P^+$-type well-contact region $22_{PCON}'$ may be formed in advance to forming the side walls 25, 25 as shown in FIG. 8. That is, as the sequence 7 of Table 1 describes, the N-type base region 27 is formed using the gate electrode 10 deposited in advance and a highly doped P+-type source region $22_{PS}'$ is self-aligned by employing the step for forming the P-type region of the bipolar transistor. At the same time, the $P^+$-type well-contact region $22_{PCON}'$ is formed in the P-type well 5. Then, the side walls 25, 25 are formed for the sake of conformity with the CMOS process for forming the LDD structure. Then, the $N^+$-type well-contact region $24_{NCON}$ is formed in the N-type well 6 by employing the step for forming the N+-type source and drain of the CMOS portion. The contact holes are opened through the insulation film 12 and the source electrode $23_{PS}$ and the drain electrode $23_{PD}$ are deposited. Since the $P^+$-type source region $22_{PS}'$ and the $P^+$-type well-contact region $22_{PCON}'$ are formed in advance to forming the side walls 25, 25 by employing the step for forming the P-type base region of the bipolar transistor, a DMOS structure, comprised of the N-type base region 27 beneath the gate electrode and the $P^+$-type source region $22_{PS}'$ is obtained as in the prior art even when the side walls are formed in advance in the DMOS portion as well as in the CMOS portion. Because of this, the DMOS portion and the CMOS portion including the side walls can be integrated into a monolithic circuit.

Figure 9:
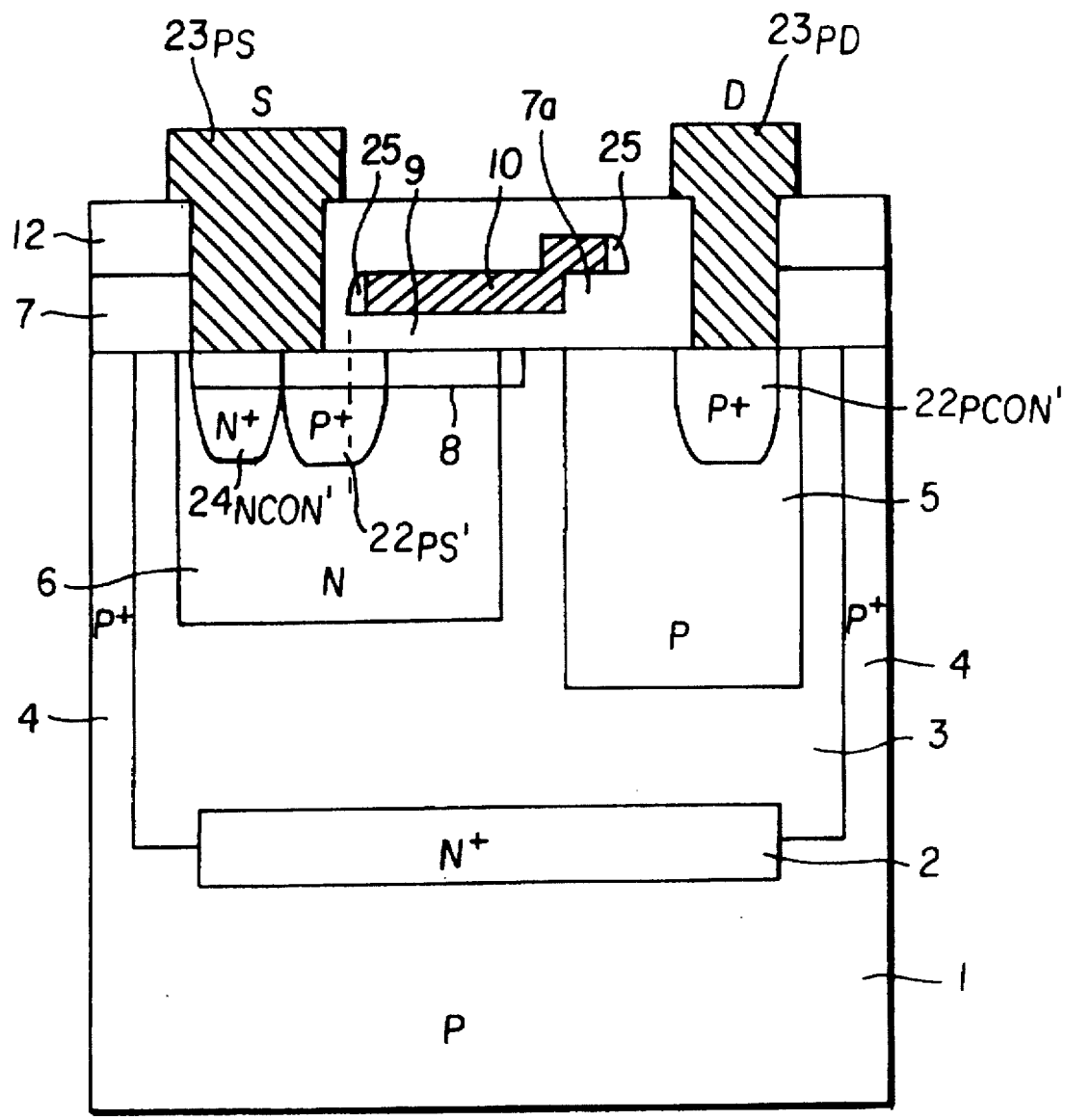
FIG. 9 is a sectional view showing a still another embodiment structure at source and drain electrode formation of the P-channel DMOSFET portion of the high withstand voltage DMOS obtained by still another BiCMOS process according to the present invention.

FIG. 9 is a sectional view showing still another embodiment of the method for manufacturing a P-channel DMOS transistor according to the present invention. The method of FIG. 9 uses the sequence 6 of Table 1 and is different from the methods of FIGS. 7 and 8 in that the N-type base region 27 is not formed in FIG. 9. However, a DMOS structure is formed which comprises the $P^+$-type source region $22_{PS}'$ formed by employing a CMOS process, and the N-type well 6. Alternatively, the $P^+$-type source region $22_{PS}'$ may be formed according to the sequence 5 of Table 1 by employing the step for forming the P-type base region of the bipolar transistor.

Figure 10:
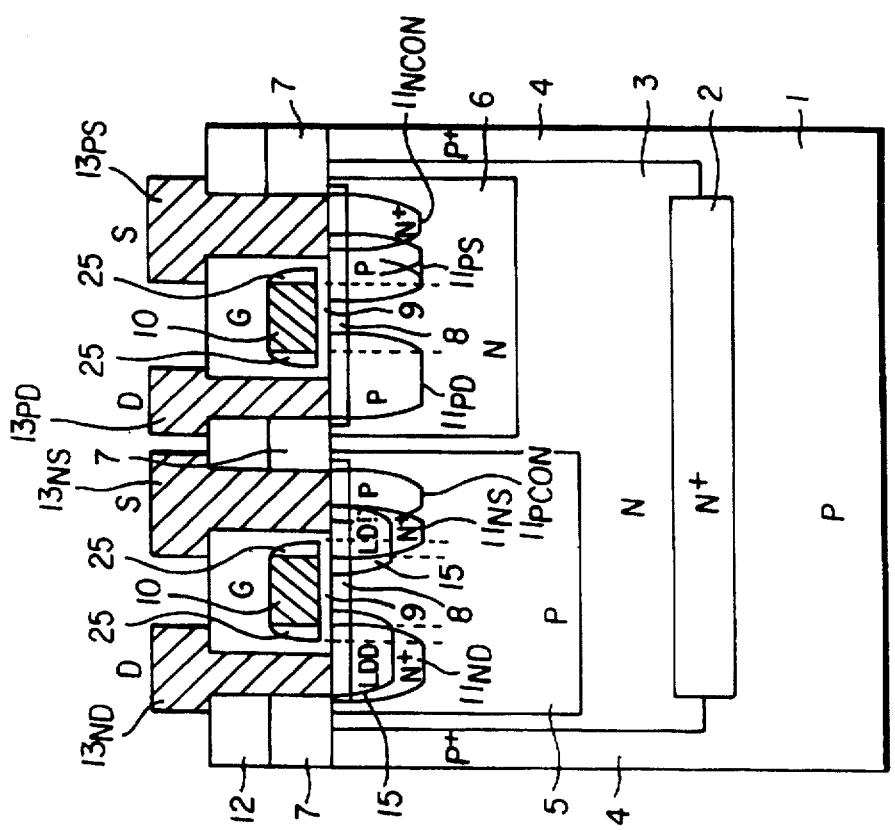
FIG. 10 is a sectional view showing an embodiment structure at source and drain electrode formation of the low withstand voltage CMOS portion obtained by the BiCMOS process according to the present invention.

FIG. 10 is a sectional view showing a CMOS portion of the BiCMOS according to the present invention. The method for manufacturing the CMOS portion will be explained with reference to FIG. 10. As described by the sequence 9 of Table 1, in FIG. 10, an N-type epitaxial layer 3 is grown over an $N^+$-type buried layer 2 formed on a P-type semiconductor substrate 1. An isolated element island is then defined by forming $P^+$-type element isolation layers 4, 4 which reach the P-type semiconductor substrate 1. A P-type well 5 and an N-type well 6 are formed in the isolated element island by ion-implantation for the P- and N wells and subsequent well diffusion. An active region is then covered by nitride film etc., and element-isolating insulation film (local oxidizing film: LOCOS) 7 is formed on the P$^+$-type isolation layers 4, 4 and above between the wells 5, 6 by selectively oxidizing the nitride film. Channel ion-implanted layers 8, 8 are then formed by shallowly implanting impurities of the acceptor type (P-type) such as BF$_2$ from the surface of the P-type well 5 and the N-type well 6. Then, poly-silicon gate electrodes 10, 10 are formed on gate insulation film 9 on the P-type well 5 and the N-type well 6. Then, lightly doped N-type regions (LDD: lightly doped drain) 15, 15 are formed by implanting N-type impurities such as phosphorus using the gate electrode 10 on the P-type well 5 as a mask for self-alignment. Then, a P$^+$-type well-contact region 11$_{PCON}$ is formed in the P-type well 5 by employing the step for forming the P-type base region of the bipolar transistor. At the same time, a P$^+$-type source region 11$_{PS}$ and a P$^+$-type drain region 11$_{PD}$ are formed in the N-type well 6 by using the gate electrode 10 on the N-type well 6 as a mask for self-alignment. Then, oxidizing film is deposited by CVD etc., and side walls 25, 25 and 25, 25 are formed on the side faces of the gate electrodes 10. An N$^+$-type source region 11$_{NS}$ and an N$^+$-type drain region 11$_{ND}$ are then formed in the P-type well 5 by a self-alignment technique using the side walls 25, 25 and the gate electrode 10 as a mask. At the same time, N$^+$-type well-contact region 11$_{NCON}$ is formed in the N-type well 6. After forming inter-layer insulation film 12, contact holes are opened through the insulation film 12, and then, source electrodes 13$_{PS}$, 13$_{NS}$ and drain electrodes 13$_{PD}$, 13$_{ND}$ are formed. Thus, by constructing the N-channel MOSFET of the DMOS portion in an LDD structure, an electric field in the drain is relaxed, hot carrier injection into the gate insulation film 9 is greatly suppressed, and reliability of the N-channel MOSFET is improved by preventing the gate insulation film 9 from deteriorating with elapse of time.

A step for forming exclusively the P$^+$-type source and drain of the CMOS portion is eliminated from the above described steps for forming the LDD structure, which forms the P$^+$-type well-contact region 11$_{PCON}$ in the P-type well 5 by employing the step for forming the P$^+$-type base region of the bipolar transistor and self-aligns the P$^+$-type source region 11$_{PS}$ and the P$^+$-type drain 11$_{PD}$ in the N-type well 6 by using its gate electrode 10 as a mask. Thus, processing step decrease is realized even in constructing the LDD structure.

Figure 11:
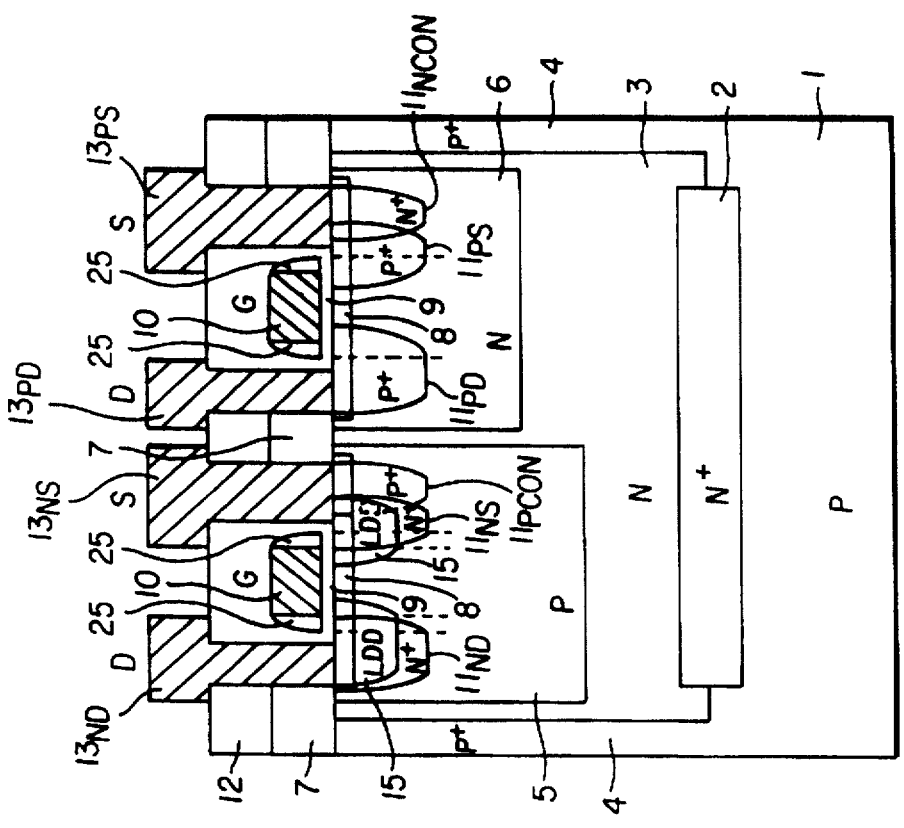
FIG. 11 is a sectional view showing another embodiment structure at source and drain electrode formation of the low withstand voltage CMOS portion obtained by the other BiCMOS process according to the present invention.

The P$^+$-type well-contact region 11$_{PCON}$, the P++-type source region 11$_{PS}$, and the P$^+$-type drain region 11$_{PD}$ may be formed by employing the step for forming the P$^+$-type source and drain of the CMOS portion as the sequence 10 of Table 1 describes. That is, as shown in FIG. 11, lightly doped N-type regions 15, 15 are self-aligned by implanting N-type impurities such as phosphorus using the gate electrode 10 on the P-type well 5 as a mask, and then, side walls 25, 25, 25, 25 are formed on the side faces of the gate electrodes 10, 10. Then, an N$^+$-type source region 11$_{NS}$ and an N$^+$-type drain region 11$_{ND}$ are self-aligned in the P-type well 5 by employing the step for forming the source 11 and drain of the CMOS portion and by using the side walls 25, 25 and the gate electrode 10 as a mask. At the same time, N$^+$-type well-contact region 11$_{NCON}$ is formed in the N-type well 6. Then, a P$^+$-type well-contact region 11$_{PCON}$, a P$^+$-type source region 11$_{PS}$, and a P$^+$-type drain region 11$_{PD}$ are formed by employing the step for forming the P$^+$-type source and drain of the CMOS portion. Since the N-channel MOSFET is formed in a LDD structure even by the manufacturing method of the prior art, hot carrier injection into the gate insulation film 9 is greatly suppressed, and reliability of the N-channel MOSFET is improved.

Figure 12:
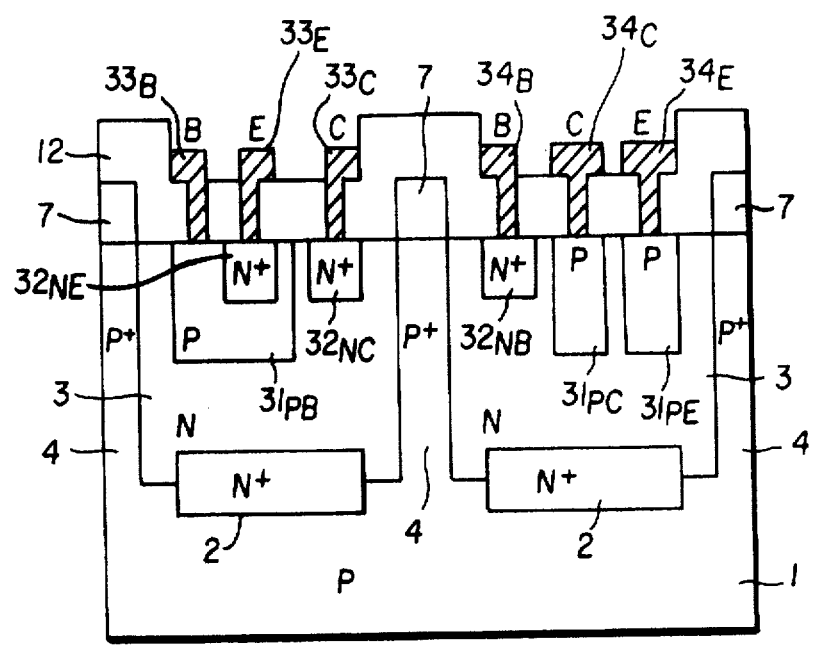
FIG. 12 is a sectional view showing an embodiment structure at electrode formation of the bipolar transistor obtained by the BiCMOS process according to the present invention.

Finally, manufacturing steps for the bipolar transistor of the BiCMOS according to the present invention will be explained. The bipolar transistor is comprised of a horizontal NPN transistor and a lateral PNP transistor as shown in FIG. 12. By the similar steps as those for the CMOS portion, an N-type epitaxial layer 3 is grown over an N$^+$-type buried layer 2 formed on a P-type substrate 1, and then, isolated element islands are defined by forming a P$^+$-type element isolation layers 4, 4, 4 which reach the P-type semiconductor substrate 1. In manufacturing the horizontal NPN transistor, as the sequence 11 of Table 1 describes, a P-type base region 31$_{PB}$ is formed in the N-type epitaxial layer 3. Then, an N$^+$-type emitter region 32$_{NE}$ and an N$^+$-type collector region 32$_{NC}$ are formed by employing the step for forming the N$^+$-type source and drain of the CMOS portion. Then, after forming inter-layer insulation film 12, contact holes are opened through the insulation film 12, and a base electrode 32$_B$, an emitter electrode 32$_E$ and a collector electrode 32$_C$ are formed. In manufacturing the lateral PNP transistor, as the sequence 12 of Table 1 describes, an N$^+$-type base region 32$_{NB}$ is formed by employing the step for forming the N$^+$-type source and drain of the CMOS portion, after forming in the epitaxial layer 3 a P$^+$-type emitter region 31$_{PE}$ and a P$^+$-type collector region 31$_{PC}$ by employing the step for forming the P-type base region 31$_{PB}$ of the horizontal transistor. Then, after forming the inter-layer insulation film 12, contact holes are opened through the insulation film 12, and a base electrode 34$_B$, an emitter electrode 34$_E$ and a collector electrode 34$_C$ are formed.

The step for forming the N$^+$-type source and drain of the DMOS portion may be employed for forming the N$^+$-type emitter region 32$_{NE}$ and the N$^+$-type collector region 32$_{NC}$ of the NPN transistor as the sequence 13 of Table 1 describes. The step for forming the N$^+$-type emitter region 32$_{NE}$ and the N$^+$-type collector region 32$_{NC}$ of the horizontal NPN transistor may be employed for forming the N type base region (base contact region) 32$_{NB}$ as the sequence 14 of Table 1 describes. The P$^+$-type emitter region 31$_{PE}$ and the P$^+$-type collector region 31$_{PC}$ of the horizontal NPN transistor may be formed by employing the step for forming the P$^{1+}$-type source and drain of the CMOS portion.

Figure 13:
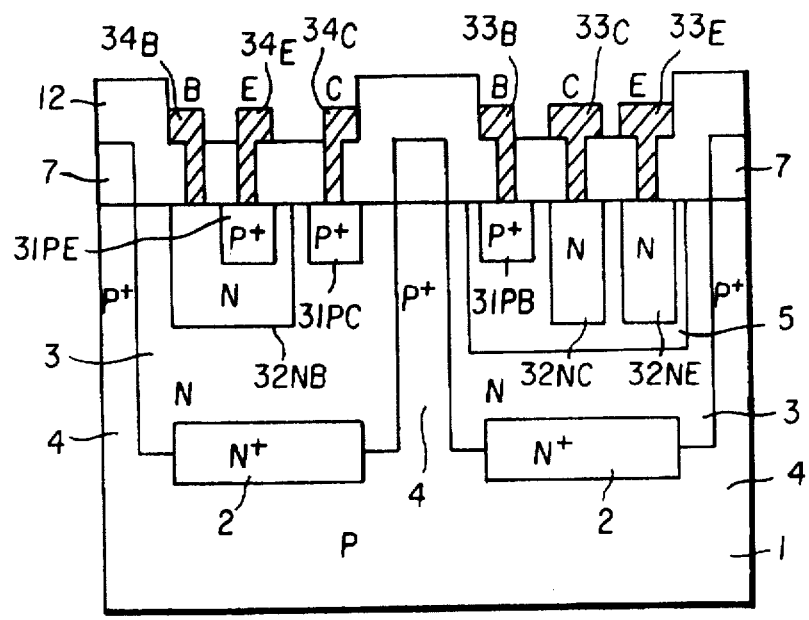
FIG. 13 is a sectional view showing another embodiment structure at electrode formation of the bipolar transistor in another BiCMOS process according to the present invention.
Figure 15:
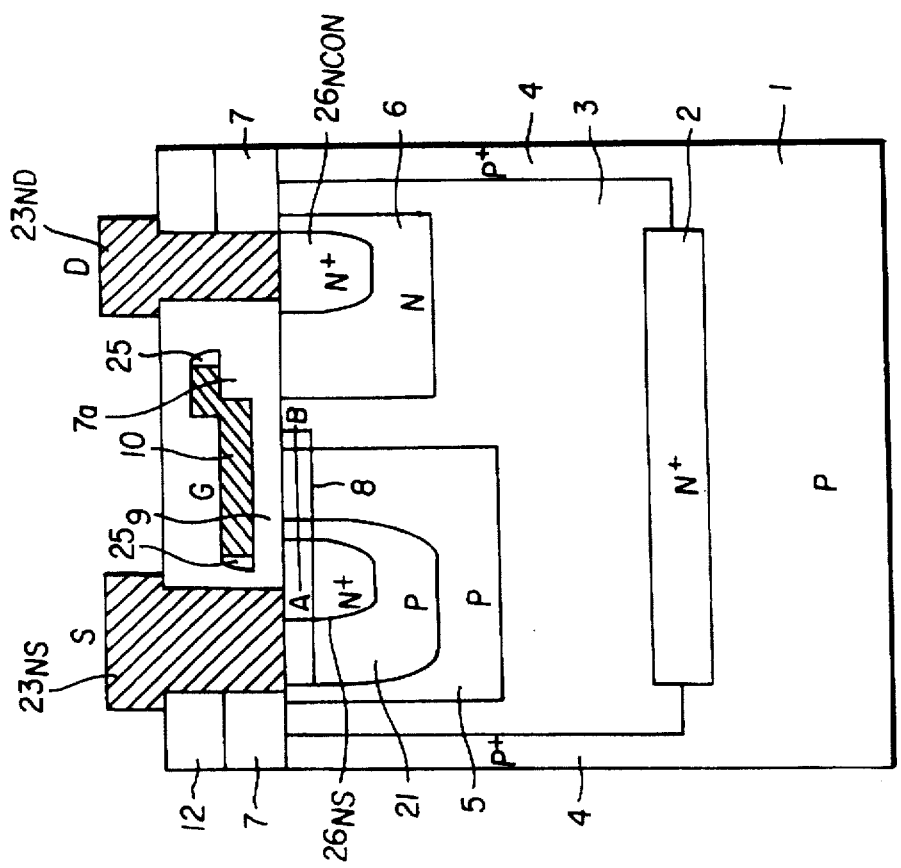
FIG. 15 is a sectional view showing an exemplary structure at source and drain electrode formation of the high withstand voltage DMOS portion of the BiCMOS according to the prior art.
Figure 14:
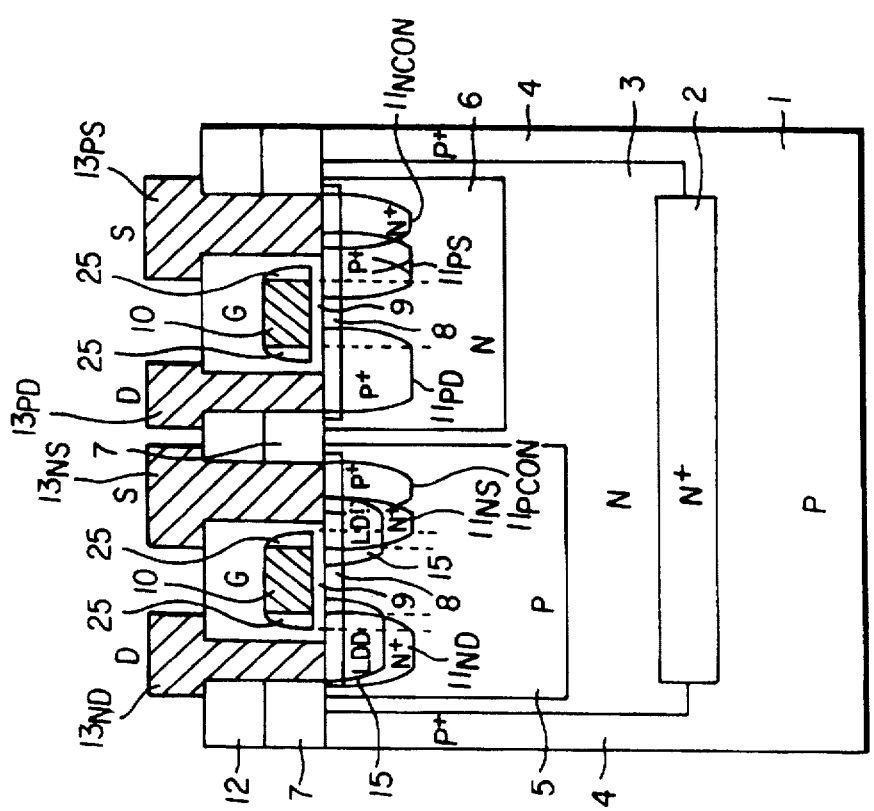
FIG. 14 is a sectional view showing an exemplary structure at source and drain electrode formation of the low withstand voltage CMOS portion in the BiCMOS process according to the prior art.
Figure 17:
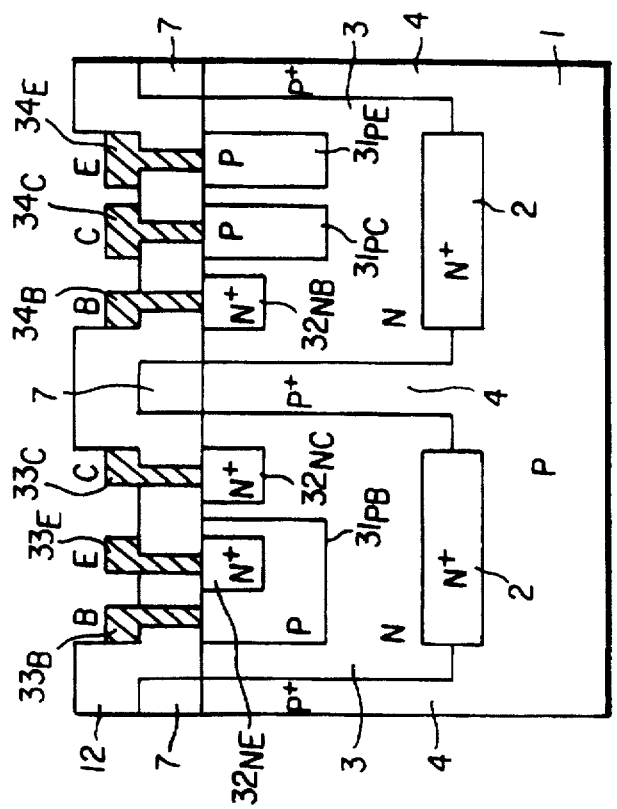
FIG. 17 is a sectional view showing an exemplary structure at electrode formation of the bipolar transistor in the BiCMOS according to the prior art.
Figure 16:
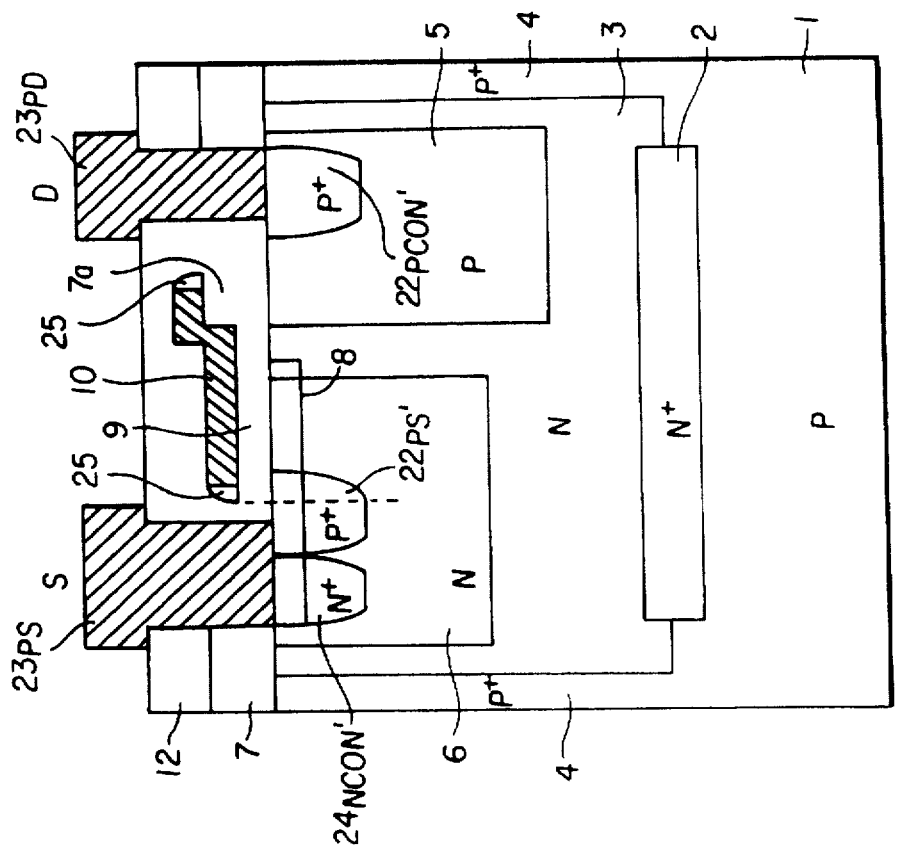
FIG. 16 is a sectional view showing another exemplary structure at source and drain formation of the high withstand voltage DMOS portion of the BiCMOS according to the prior art.

The bipolar transistor may be manufactured by the process sequences 15, 16 of Table 1. An N-type epitaxial layer 3 is grown over an N$^+$-type buried layer 2 formed on a P-type substrate 1. P$^+$-type element isolation layers 4, 4, 4 are formed and then a P-type well 5 is formed. Then, an N type base region 32$_{NB}$ of the PNP transistor is formed in the epitaxial layer 3. At the same time, an N+-type collector region 32$_{NC}$ and an N$^+$-type emitter region 32$_{NE}$ of the NPN transistor are formed in the P-type well 5. Further, a P$^+$-type emitter region 31$_{PE}$ and a P$^+$-type collector region 31$_{PC}$ of the PNP transistor are formed by employing the step for forming the P$^+$-type source and drain of the CMOS process. At the same time, a P$^+$-type base contact region 31$_{PB}$ of the NPN transistor is formed in the P-type well 5. Then, contact holes are opened through the insulation film 12, and base electrodes 33$_B$, 34$_B$, emitter electrodes 33$_E$, 34$_E$, and collector electrodes 33$_C$, 34$_C$ are formed. Thus, by employing the processing steps for forming the P-type well and the N-type base, a combination of a lateral NPN transistor and a horizontal PNP transistor having a configuration shown in FIG. 13 reversal to the configuration of FIG. 12 may be obtained. Other detailed variations may be facilitated.

Though the embodiments of present invention is explained by way of the junction separation scheme which separates the devices (elements) by the P⁺-type element isolation layers 4, 4 (or 4, 4, 4) after growing the epitaxial layer over the P-type semiconductor substrate 1, the present invention is applicable also to the self-separation scheme which separates the devices by a P-type or an N-type semiconductor substrate.

As described above, the present invention is featured by the elimination of the base drive step exclusive for the DMOS portion and by the side wall formation which facilitates securing the maximum impurity concentration in the base region beneath the gate electrode in the DMOS portion. Therefore, the method of manufacturing a semiconductor device according to the present invention shows following effects:

(1) By optimizing the conditions for the side wall formation, the base drive step is eliminated. Due to this, the processing steps are reduced, the manufacturing period of time is shortened, and the manufacturing cost is reduced.

(2) By the elimination of the high temperature heat treatment step, defects and faults caused in the semiconductor devices by the heat treatment are reduced.

(3) When the semiconductor device is a CMOS semiconductor device, the processing steps are further reduced by forming the CMOS portion in a LDD structure and by employing the steps for forming the side walls, wells, source and drain of the CMOS transistor to the steps for forming side walls, wells, source and drain of the DMOS portion. Further, the CMOS portion with the LDD structure can be integrated with the DMOS portion into a monolithic circuit. Moreover, since the gate insulation film of the CMOS portion is prevented from hot carriers injection, the reliability of the device is improved.

(4) When the semiconductor device is a BiCMOS semiconductor device, the processing steps are further reduced by employing the steps for forming the base region and the emitter region of the bipolar transistor to forming the base region, source region and drain region of the DMOS portion. Further, since the light doping in the base region is facilitated, the current amplification factor $h_{FE}$ of the bipolar transistor is improved.

The invention has been described with reference to certain preferred embodiments thereof. It will be understood, however, that modifications and variations are possible within the scope of the appended claims.

What is claimed is:

1. A method of manufacturing a semiconductor device, including an n-channel DMOS transistor, consisting essentially of the steps of:
   forming a well of a p-type conductivity in a semiconductor region of n-type conductivity type;
   forming a gate electrode on gate insulation film deposited on said semiconductor region;
   forming a base region of p-type conductivity from a major face of said well by using said gate electrode as a first mask for self-alignment of said base region;
   forming side walls on side faces of said gate electrode, said step of forming said side walls being employed for driving dopants of the n-type conductivity into said base region; and
   forming a source region of n-type conductivity from a major face of said base region using said side walls as a second mask for self-alignment of said source region.

2. The method as claimed in claim 1, wherein said side walls are formed by thermal oxidation.

3. The manufacturing method as claimed in claim 1, wherein said side walls are formed by a CVD method under pressure that is reduced below atmospheric pressure.

4. A method of manufacturing a semiconductor device, including a p-channel DMOS transistor, consisting essentially of the steps of:
   forming a gate electrode on gate insulation film deposited on a semiconductor of a n-type conductivity;
   forming a base region of n-type conductivity by using said gate electrode as a first mask for self-alignment of said base region;
   forming side walls on side faces of said gate electrode, said step of forming said side walls being employed for driving said base region; and
   forming a source region of p-type conductivity type from a major face of said base region using said side walls as a second mask for self-alignment of said source region.

5. The method as claimed in claim 4, wherein said side walls are formed by thermal oxidation.

6. The manufacturing method as claimed in claim 4, wherein said side walls are formed by a CVD method under pressure that is reduced below atmospheric pressure.

7. A method of manufacturing a semiconductor device, including a p-channel DMOS transistor, consisting essentially of the steps of:
   forming a channel ion-implanted layer by implanting impurity ions of a p-type on a side in a semiconductor region of n-type conductivity;
   forming a gate electrode on gate insulation film deposited on said semiconductor region;
   forming a base region of n-type conductivity on the side of said channel ion-implanted layer in said semiconductor region using said gate electrode as a first mask for self-alignment of said base region;
   forming side walls on side faces of said gate electrode, said step of forming said side walls being employed for driving said base region; and
   forming a source region of p-type conductivity from a major face of said base region using said side walls as a second mask for self-alignment of said source region.

8. The method as claimed in claim 7, wherein said side walls are formed by thermal oxidation.

9. The manufacturing method as claimed in claim 7, wherein said side walls are formed by a CVD method under pressure that is reduced below atmospheric pressure.

10. A method of manufacturing a semiconductor device, including n-channel DMOS transistor, consisting essentially of the steps of:
    forming a channel ion-implanted layer by implanting impurity ions of a p-type from a major face of a well of p-type conductivity formed in an n-type semiconductor region;
    forming a gate electrode on a gate insulation film deposited on said semiconductor region;
    forming a base region of p-type second conductivity from said major face of said well by using said gate electrode as a first mask for self-alignment of said base region;
    forming side walls on side faces of said gate electrode, said step of forming said side walls being employed for driving dopants of the p-type second conductivity into said base region; and
    forming a source region of n-type conductivity from a major face of said base region using said side walls as a second mask for self-alignment of said source region.

11. The method as claimed in claim 10, wherein said side walls are formed by thermal oxidation.

12. The manufacturing method as claimed in claim 10, wherein said side walls are formed by a CVD method under pressure that is reduced below atmospheric pressure.

* * * * *